(12) United States Patent
Kim et al.

(10) Patent No.: US 7,413,966 B2
(45) Date of Patent: Aug. 19, 2008

(54) METHOD OF FABRICATING POLYSILICON THIN FILM TRANSISTOR WITH CATALYST

(75) Inventors: Binn Kim, Seoul (KR); Jong-Uk Bae, Seoul (KR); Hae-Yeol Kim, Gyeonggi-do (KR)

(73) Assignee: LG Phillips LCD Co., Ltd, Seoul (KR)

( * ) Notice: Subject to any disclaimer, the term of this patent is extended or adjusted under 35 U.S.C. 154(b) by 0 days.

(21) Appl. No.: 10/310,964

(22) Filed: Dec. 6, 2002

(65) Prior Publication Data
US 2003/0162333 A1 Aug. 28, 2003

(30) Foreign Application Priority Data

| Dec. 29, 2001 | (KR) | 10-2001-0087728 |
| Dec. 29, 2001 | (KR) | 10-2001-0087729 |
| Dec. 29, 2001 | (KR) | 10-2001-0087730 |
| Dec. 29, 2001 | (KR) | 10-2001-0087731 |

(51) Int. Cl.
*H01L 21/20* (2006.01)
*H01L 21/00* (2006.01)

(52) U.S. Cl. .................. 438/486; 438/149; 438/486; 438/488; 438/775; 438/776; 438/FOR. 184; 438/FOR. 201; 257/E21.411; 257/E21.416; 257/E21.132; 260/DIG. 35

(58) Field of Classification Search .............. 438/151, 438/166, 200, 486, 149, 488, 775, 776, FOR. 184, 438/FOR. 201; 257/E21.703, E21.411, E21.416, 257/E21.132
See application file for complete search history.

(56) References Cited

U.S. PATENT DOCUMENTS

| 5,534,716 | A | * | 7/1996 | Takemura | 257/72 |
| 5,970,366 | A | * | 10/1999 | Okonogi | 438/471 |
| 6,020,260 | A | * | 2/2000 | Gardner | 438/657 |
| 6,084,247 | A | * | 7/2000 | Yamazaki et al. | 257/58 |
| 6,096,572 | A | * | 8/2000 | Nakamura | 438/30 |

OTHER PUBLICATIONS

Wolf, Silicon Processing for the VLSI Era, vol. 1, Lattice Press, 1986, p. 109.*
Ghandhi, VLSI Fabrication Principles, John Wiley & Sons, Inc., 1994, pp. 639-643.*

* cited by examiner

*Primary Examiner*—Thanh V Pham
(74) *Attorney, Agent, or Firm*—McKenna Long & Aldridge LLP

(57) ABSTRACT

A method of forming a polycrystalline silicon active layer for use in a thin film transistor is provided. The method includes forming a buffer layer over a substrate, forming an amorphous silicon layer over the buffer layer, applying a catalytic metal to a surface of the amorphous silicon layer, crystallizing the amorphous silicon layer having the catalytic metal thereon into a polycrystalline silicon layer, annealing the polycrystalline silicon layer in an $N_2$ gas atmosphere to stabilize the polycrystalline silicon layer, etching a surface of the polycrystalline silicon layer using an etchant, and patterning the polycrystalline silicon layer to form an island-shaped active layer.

17 Claims, 11 Drawing Sheets

METHOD OF FABRICATING POLYSILICON THIN FILM TRANSISTOR WITH CATALYST

This application claims the benefit of Korean Application Nos. 2001-87728, 2001-87729, 2001-87730, and 2001-87731, all filed on Dec. 29, 2001 in Korea, all of which are hereby incorporated by reference.

This application also incorporates by reference the following three (3) U.S. patent applications that are filed concurrently with the filing of the instant application:

(1) Application Ser. No. 10/310,965, filed Dec. 6, 2003, entitled "Method of Fabricating Polycrystalline Thin Film Transistor," of Inventors: Hyen-Sik SEO, Binn KIM, and Jong-Uk BAE;

(2) application Ser. No. 10/310,975, filed Dec. 6, 2003, now U.S. Pat. No. 6,727,122, entitled "Method of Fabricating Polycrystalline Thin Film Transistor," of Inventors: Hyen-Sik SEO, Binn KIM, Jong-Uk BAE, and Hae-Yeol KIM; and (3) application Ser. No. 10/310,966, filed Dec. 6, 2003. entitled "Method of Fabricating Polycrystalline Thin Film Transistor," of Inventors: Hyen-Sik SEO, Binn KIM, and Jong-Uk BAE.

BACKGROUND OF THE INVENTION

1. Field of the Invention

The present invention relates to a method of crystallizing amorphous silicon, and more particularly, to a method of fabricating a polycrystalline silicon thin film transistor (TFT). Although the present invention is suitable for a wide scope of applications, it is particularly suitable for improving electrical characteristics of the thin film transistor.

2. Discussion of the Related Art

In a conventional process for forming a polycrystalline silicon layer, an intrinsic amorphous silicon layer is formed on an insulating substrate by using a Plasma Chemical Vapor Deposition (PCVD) method or a Low Pressure Chemical Vapor Deposition (LPCVD) method. After the amorphous silicon layer has a thickness of about 500 Å (angstroms), it is re-crystallized into a polycrystalline silicon layer by using a crystallization method. The crystallization method is generally classified into one of an Excimer Laser Crystallization (ELC) method, a Solid Phase Crystallization (SPC) method, a Metal Induced Crystallization (MIC) method, and a Metal Induced Lateral Crystallization (MILC).

In the ELC method, an insulating substrate where an amorphous silicon layer is formed is heated to a temperature of about 250° C. An excimer laser beam is then applied to the amorphous silicon layer to form a polycrystalline silicon layer. In the SPC method, the amorphous silicon layer is heat-treated at a high temperature for a long time to be crystallized into a polycrystalline silicon layer. In the MIC method, a metal layer is deposited on the amorphous silicon layer and the deposited metal is used for crystallization. In the MIC method, a large-sized glass substrate can be used as an insulating substrate. In the MILC method, a metal is first formed on the amorphous silicon layer, and then the amorphous silicon layer is crystallized. Also in the MILC method, an oxide pattern is formed on a predetermined active portion of the amorphous silicon layer. The amorphous silicon layer becomes polycrystalline silicon by a lateral growth of grains.

The Excimer Laser Crystallization (ELC) process has also been used with some advantages in annealing amorphous silicon. The excimer laser allows areas of the amorphous silicon film to be exposed to very high temperatures for very short periods of time. Theoretically, this offers a possibility of annealing the amorphous silicon film at an optimum temperature of less than 400 degrees Celsius without degrading the underlying substrate upon which it is mounted. However, use of this method has been limited by the lack of control over some of the process steps. Typically, an aperture size of the laser is relatively small. Due to the aperture size, power of the laser, and a thickness of the film, multiple laser passes or shots may be required to complete an annealing process. Since it is difficult to precisely control the laser, the multiple shots introduce non-uniformities into the annealing process. Further, the substrates must be annealed serially in a furnace rather than simultaneously in a furnace. As a result, TFTs made by this method are significantly more expensive.

In the SPC method, a buffer layer is formed on a quartz substrate that can stand a temperature higher than 600° C. The buffer layer serves to prevent a contamination from the quartz substrate. Thereafter, an amorphous silicon layer is deposited on the buffer layer and is sufficiently heat-treated in a furnace at a high temperature so as to form a polycrystalline silicon layer. However, because the SPC method is performed at the high temperature for a long period of time, it is difficult to acquire a desired crystalline silicon phase.

In the process of SPC method, because the crystalline grains develop without a continuous directionality, the polycrystalline silicon layer may have an irregular surface. For a thin film transistor, a gate insulating layer covers the polycrystalline silicon layer. Therefore, if the polycrystalline silicon layer has the irregular surface, the gate insulating layer is also irregularly formed, thereby decreasing a breakdown voltage of the thin film transistor. In addition, the sizes of the polycrystalline silicon grains formed by the SPC method are very irregular, thereby deteriorating electrical characteristics of a device adopting the polycrystalline silicon layer. Furthermore, the quartz substrate used for the SPC method is very expensive, thereby increasing the fabrication costs.

Unlike the SPC method that uses an expensive quartz substrate, the MIC method and the MILC method may utilize a relatively inexpensive glass substrate for forming polycrystalline silicon. In the MIC method and the MILC method, however, metal impurities may remain in the polycrystalline silicon network, thereby deteriorating the quality of the polycrystalline silicon layer. To alleviate this residual impurity problem, the conventional art employs the following method, which will be described with reference to FIGS. 1A to 1C and 2A to 2E.

FIGS. 1A to 1C are perspective views illustrating process steps of forming a polycrystalline silicon layer according to the conventional art.

Referring to FIG. 1A, a buffer layer 12 and an amorphous silicon (a-Si:H) layer 4 are sequentially deposited on a substrate 10. The buffer layer 12 is silicon nitride ($SiN_x$) or silicon oxide ($SiO_2$), and prevents alkali substances included in the substrate 10 from spreading into the amorphous silicon layer 4. Thereafter, the amorphous silicon layer 4 is dehydrogenated by a heat-treatment.

Referring to FIG. 1B, a catalytic metal 16 is formed on the surface of the amorphous silicon layer 4. For the catalytic metal 16, Nickel (Ni), Lead (Pb) or Cobalt (Co) is preferably employed. An ion shower method, an ion doping method, a sputtering method or a chemical vapor deposition (CVD) method is employed for the formation of the catalytic metal 16. After forming the catalytic metal, the amorphous silicon layer 4 is heated and then converted into a polycrystalline silicon layer 15 as shown in FIG. 1C.

FIGS. 2A to 2D are cross-sectional views illustrating process steps of forming a thin film transistor having a polycrystalline silicon layer according to the conventional art.

Referring to FIG. 2A, a buffer layer 2 is first formed on the substrate 10. Thereafter, a polycrystalline silicon layer is formed on the buffer layer 2 using the process mentioned with reference to FIGS. 1A to 1C, and then patterned to form an island-shaped active layer 8.

Referring to FIG. 2B, a gate insulation layer 11 and a gate electrode 12 are formed on the active layer 8. The active layer 8 is divided into two areas: a first active area 14 that is an intrinsic silicon area, and second active areas 16 and 17 where impurity ions are to be doped. The gate insulation layer 11 and the gate electrode 12 are disposed to define the first active area 14. The second active areas 16 and 17 of the active layer 8 are positioned on respective sides of the first active area 14. The gate insulation layer 11 is made of silicon nitride ($SiN_x$), silicon oxide ($SiO_2$) or Tetra Ethoxy Silane (TEOS).

After forming the gate insulation layer 11 and the gate electrode 12 on the first active area 14 of the active layer 8, p-type ions, such as boron, are doped into the second active areas 16 and 17. Since the gate electrode 12 is disposed above the first active area 14 and acts as an ion stopper, the dopant p-type ions are not doped into the first active area 14. Thus, the first active area 14 remains as an intrinsic silicon region, whereas the second active areas 16 and 17 become doped silicon regions. Namely, the second active areas 16 and 17 become source and drain regions, respectively. The above-mentioned dopant (p-type ions) includes a group III element, such as boron (B). For example, $B_2H_6$ is used for the dopant. After the ion doping is finished, the doped portions 16 and 17 of the island-shaped active layer 8 includes p-type semiconductor source and drain regions.

Referring to FIG. 2C, an interlayer insulator 18 is formed to cover the gate electrode 12, the first active area 14, and the second active areas 16 and 17. A source contact hole 16a and a drain contact hole 17a are formed throughout the interlayer insulator 18, thereby exposing the second active areas 16 and 17, respectively. As mentioned above, the second active areas 16 and 17 are source and drain regions on which source and drain electrodes are formed, respectively.

Referring to FIG. 2D, a source electrode 20 and a drain electrode 22 are formed on the interlayer insulator 18. The source and drain electrodes 20 and 22 electrically contact the source and drain regions 16 and 17, respectively, through the respective source and drain contact holes 16a and 17a. This completes a thin film transistor having p-type polycrystalline source and drain regions.

Thereafter, a passivation layer 26 is formed to cover the source and drain electrodes 20 and 22, and then patterned to form a pixel contact hole 27 that exposes a potion of the drain electrode 22. On the surface of the passivation layer 26, a transparent conductive material is deposited and then patterned to form a pixel electrode 28. Thus, the pixel electrode 28 formed on the passivation layer 26 electrically contacts the drain electrode 22 through the pixel contact hole 27.

In the conventional process of fabricating the polycrystalline silicon TFT, since the catalytic metal is used for the amorphous silicon crystallization, the residue of the catalytic metal can remain in the active layer of the thin film transistor. The residual catalytic metal adversely affects the carrier mobility in the thin film transistor, thereby causing the malfunction of thin film transistor and degradation of electrical properties. Furthermore, the residual catalytic metal in the active layer contributes to increased leakage current in the thin film transistor, and causes the increase of a threshold voltage.

SUMMARY OF THE INVENTION

Accordingly, the present invention is directed to a method for fabricating a polycrystalline silicon thin film transistor that substantially obviates one or more of the problems due to limitations and disadvantages of the related art.

An advantage of the present invention is to provide a method for fabricating a polycrystalline silicon thin film transistor, which effectively removes a residual catalytic metal from a polycrystalline silicon layer.

Another advantage of the present invention is to provide a method of fabricating a polycrystalline silicon thin-film transistor, in which a polycrystalline silicon layer is annealed in the $N_2$ gas atmosphere to stabilize its surface.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of forming a polycrystalline silicon active layer for use in a thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; annealing the polycrystalline silicon layer in an $N_2$ gas atmosphere to stabilize the polycrystalline silicon layer; etching a surface of the polycrystalline silicon layer using an etchant; and patterning the polycrystalline silicon layer to form an island-shaped active layer. The step of applying a catalytic metal may include forming dots of the catalytic metal on the surface of the amorphous silicon layer. Annealing the polycrystalline silicon layer may include applying heat to the polycrystalline silicon layer. The catalytic metal is nickel (Ni), lead (Pb) or cobalt (Co), for example. The etchant used in etching the surface of the polycrystalline silicon layer may include hydrogen fluoride (HF). Crystallizing the amorphous silicon layer may include applying heat to the amorphous silicon layer. The buffer layer may include at least one of silicon oxide ($SiO_2$) and silicon nitride ($SiN_x$), for example.

In another aspect, the present invention provides a method of forming a polycrystalline silicon thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; annealing the polycrystalline silicon layer in an $N_2$ gas atmosphere to stabilize the polycrystalline silicon layer; etching a surface of the polycrystalline silicon layer using an etchant; patterning the polycrystalline silicon layer to form an island-shaped active layer; forming a gate insulation layer on a first area of the island-shaped active layer; forming a gate electrode on the gate insulation layer; applying a dopant to the island-shaped active layer using the gate electrode as a mask to form source and drain regions on respective sides of the first active area; forming a second insulation layer to cover the gate electrode and the source and drain regions; forming source and drain contact holes in the second insulation layer to expose portions of the source region and the drain region, respectively; and forming source and drain electrodes, the source electrode contacting the source region through the source contact hole, and the drain electrode contacting the drain region through the drain contact hole. The step of applying a catalytic metal may include forming dots of the catalytic metal on the surface of the amorphous silicon layer. Annealing the polycrystalline silicon layer may include applying heat to the polycrystalline silicon layer. The catalytic metal preferably is nickel (Ni), lead (Pb), or cobalt (Co), for example. The etchant used in etching the surface of the polycrystalline silicon layer may include hydrogen fluoride (HF). Crystallizing the amorphous silicon layer may include applying heat to the amorphous silicon layer. The buffer layer may include at least one of silicon oxide ($SiO_2$) or silicon nitride ($SiN_x$), for example. The gate insulation layer may include at least one of silicon oxide ($SiO_2$), silicon nitride ($SiN_x$) and tetra ethoxy silane(TEOS), for example. Applying a dopant to the island-shaped active layer may include doping a $B_2H_6$ gas to the island-shaped active layer using the gate electrode as a mask to form p-type source and drain regions.

In another aspect, the present invention provides a method of forming a polycrystalline silicon active layer for use in a thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; annealing the polycrystalline silicon layer in an $N_2$ gas atmosphere to stabilize the polycrystalline silicon layer; forming an island pattern on the polycrystalline silicon layer, thereby defining an active region underneath in the polycrystalline silicon layer; applying n-type ions to the polycrystalline silicon layer and then heat-treating the polycrystalline silicon layer to remove the catalytic metal from the active region underneath the island pattern; and patterning the polycrystalline silicon layer using the island pattern as a mask to form an active layer. The step of applying a catalytic metal may include forming dots of the catalytic metal on the surface of the amorphous silicon layer. Annealing the polycrystalline silicon layer may include applying heat to the polycrystalline silicon layer. When the catalytic metal is nickel (Ni), crystallizing the amorphous silicon layer may include reacting nickel (Ni) with silicon to form silicide ($NiSi_2$). In addition, crystallizing the amorphous silicon layer may include applying heat to the amorphous silicon layer. The catalytic metal may be lead (Pb) or cobalt (Co), for example. The buffer layer may include at least one of silicon oxide ($SiO_2$) and silicon nitride ($SiN_x$). The island pattern may include at least one of silicon oxide ($SiO_2$) and silicon nitride ($SiN_x$). When the n-type ions are phosphorous ions, heat-treating the polycrystalline silicon layer may include reacting the phosphorus ions with the catalytic metal. Heat-treating the polycrystalline silicon layer may include diffusing the catalytic metal out of the active region and reacting the catalytic metal with the n-type ions. The method of forming a polycrystalline silicon active layer for use in a thin film transistor may further include etching a surface of the polycrystalline silicon layer using an etchant after annealing the polycrystalline silicon layer and before forming the island pattern. Such an etchant used in etching the surface of the polycrystalline silicon layer may include hydrogen fluoride (HF).

In a further aspect, the present invention provides a method of forming a polycrystalline silicon thin film transistor. The method includes forming a buffer layer over a substrate; forming an amorphous silicon layer over the buffer layer; applying a catalytic metal to a surface of the amorphous silicon layer; crystallizing the amorphous silicon layer having the catalytic metal thereon into a polycrystalline silicon layer; annealing the polycrystalline silicon layer in an $N_2$ gas atmosphere to stabilize the polycrystalline silicon layer; forming an island pattern on the polycrystalline silicon layer to define an active region underneath in the polycrystalline silicon layer; applying n-type ions to the polycrystalline silicon layer and then heat-treating the polycrystalline silicon layer to remove the catalytic metal from the active region underneath the island pattern; patterning the polycrystalline silicon layer using the island pattern as a mask to form an island-shaped active layer; removing the island pattern from the surface of the island-shaped active layer; sequentially forming a first insulation layer and a metal layer on the buffer layer to cover the island-shaped active layer; patterning the first insulation layer and the metal layer using a single mask to form a gate insulation layer on a portion of the island-shaped active layer and to form a gate electrode on the gate insulation layer, thereby defining a first active area underneath the gate insulating layer and exposed second active areas in the island-shaped active layer; applying a dopant to the second active areas of the island-shaped active layer to form source and drain regions on respective sides of the first active area; forming a second insulation layer to cover the gate electrode and the source and drain regions; forming source and drain contact holes in the second insulation layer to expose portions of the source region and the drain region, respectively; and forming source and drain electrodes, the source electrode contacting the source region through the source contact hole, and the drain electrode contacting the drain region through the drain contact hole. The step of applying a catalytic metal may include forming dots of the catalytic metal on the surface of the amorphous silicon layer. Annealing the polycrystalline silicon layer may include applying heat to the polycrystalline silicon layer. When the catalytic metal is nickel (Ni), crystallizing the amorphous silicon layer may include reacting nickel (Ni) with silicon to form silicide ($NiSi_2$). In addition, crystallizing the amorphous silicon layer may include applying heat to the amorphous silicon layer. The catalytic metal may be lead (Pb) or cobalt (Co), for example. The buffer layer may include at least one of silicon oxide ($SiO_2$) and silicon nitride ($SiN_x$). The island pattern may include at least one of silicon oxide ($SiO_2$) and silicon nitride ($SiN_x$). The first insulation layer may include at least one of silicon oxide ($SiO_2$), silicon nitride ($SiN_x$) and tetra ethoxy silane(TEOS). When the n-type ions are phosphorous ions, heat-treating the polycrystalline silicon layer may include reacting the phosphorus ions with the catalytic metal. Heat-treating the polycrystalline silicon layer may include diffusing the catalytic metal out of the active region and reacting the catalytic metal with the n-type ions. Applying a dopant to the second active areas of the island-shaped active layer may include doping a $B_2H_6$ gas to the second active areas to form p-type source and drain regions. The method of forming a polycrystalline silicon thin film transistor may further include etching a surface of the polycrystalline silicon layer using an etchant after annealing the polycrystalline silicon layer and before forming the island pattern. Such an etchant used in etching the surface of the polycrystalline silicon layer may include hydrogen fluoride (HF).

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the embodiments of the present invention, examples of which are illustrated in the accompanying drawings. Wherever possible, the similar reference numbers will be used throughout the drawings to refer to the same or like parts.

Figure 1A:
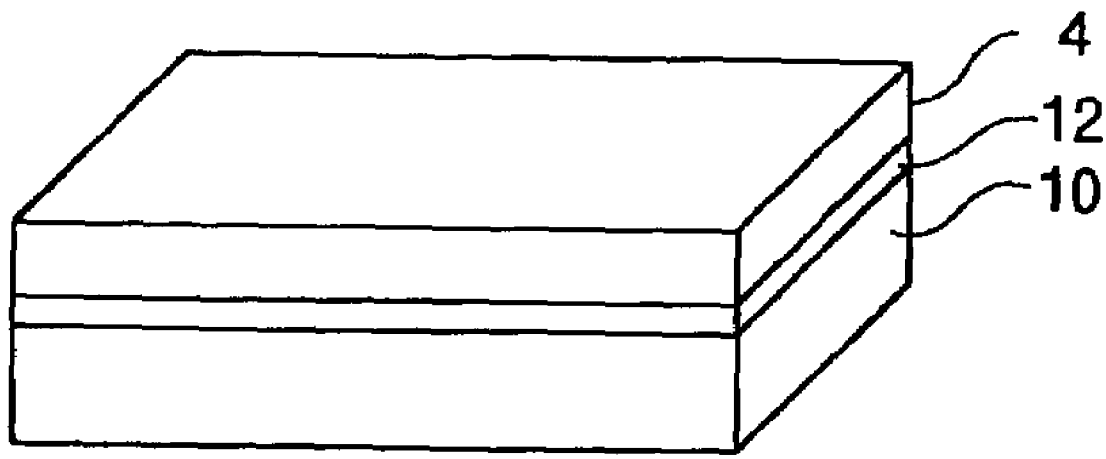
FIGS. 1A to 1C are perspective views illustrating process steps of forming a polycrystalline silicon layer according to a conventional art.
Figure 1B:
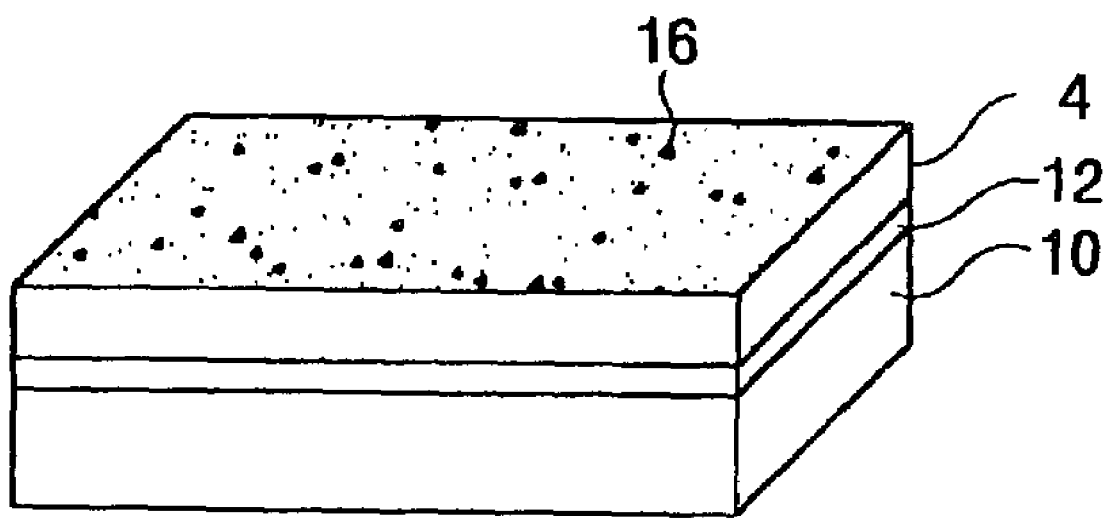
Figure 1C:
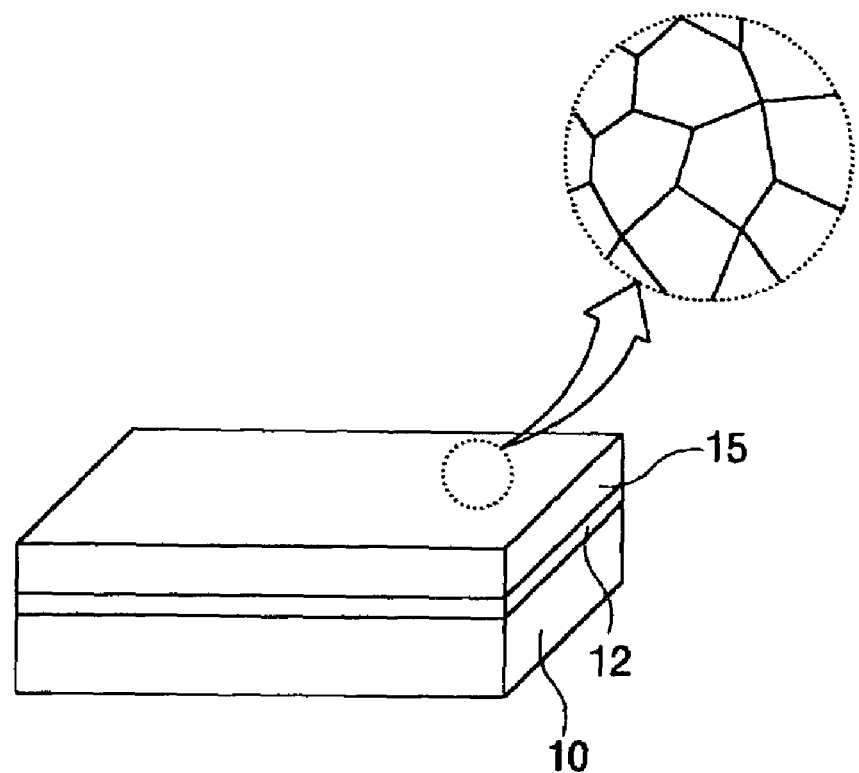
Figure 2A:
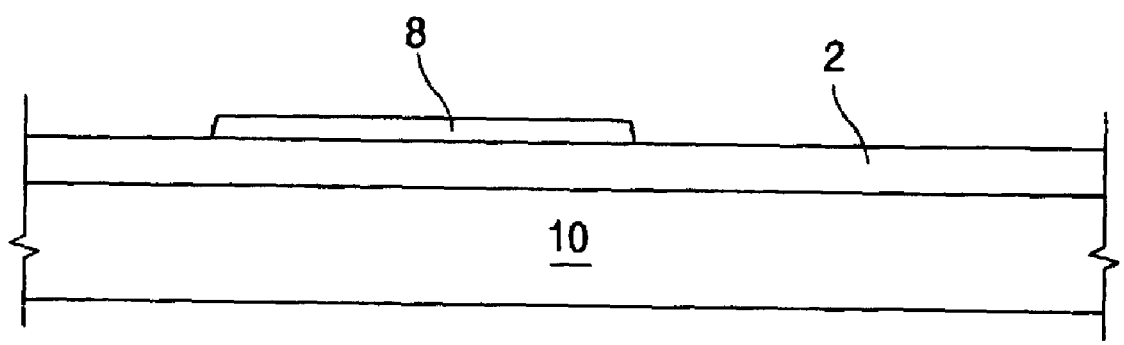
FIGS. 2A to 2D are cross-sectional views illustrating process steps of forming a thin film transistor using a polycrystalline silicon layer according to the conventional art.
Figure 2B:
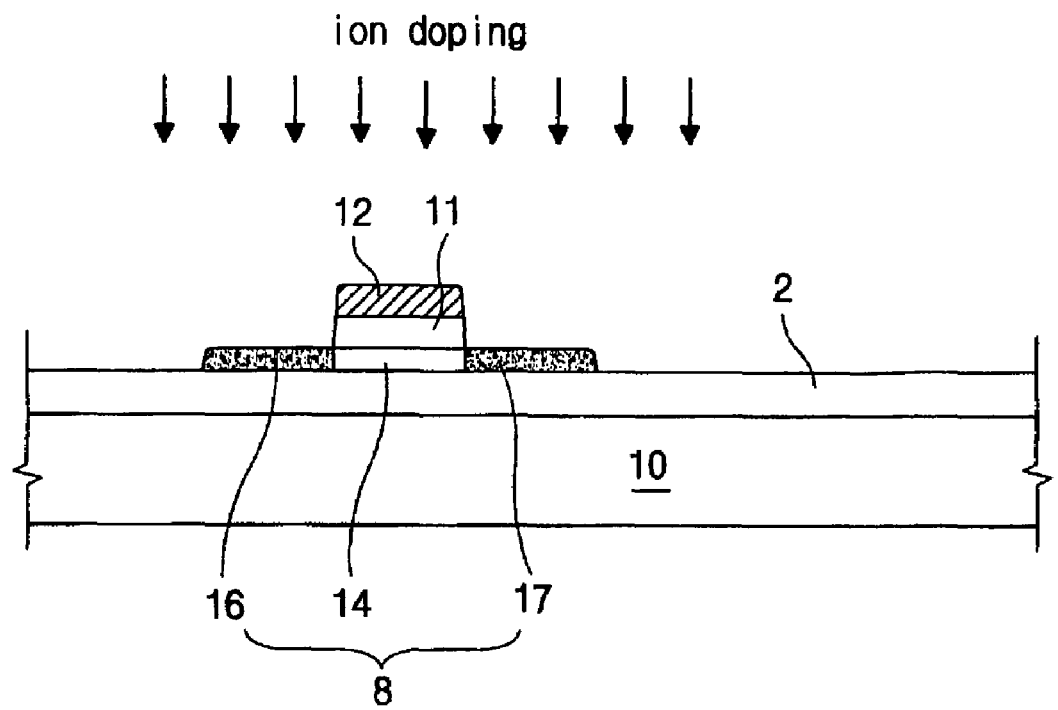
Figure 2C:
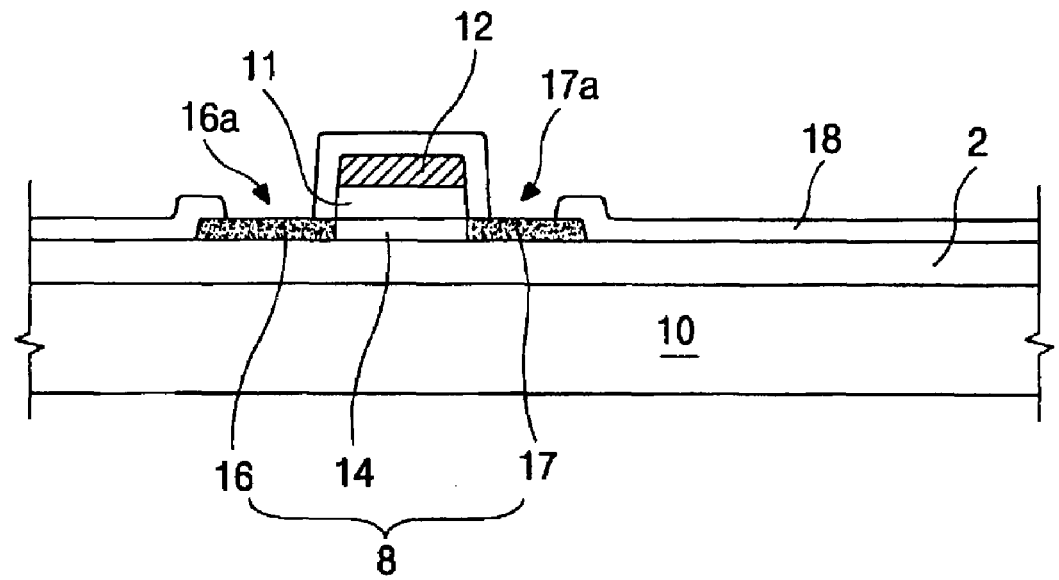
Figure 2D:
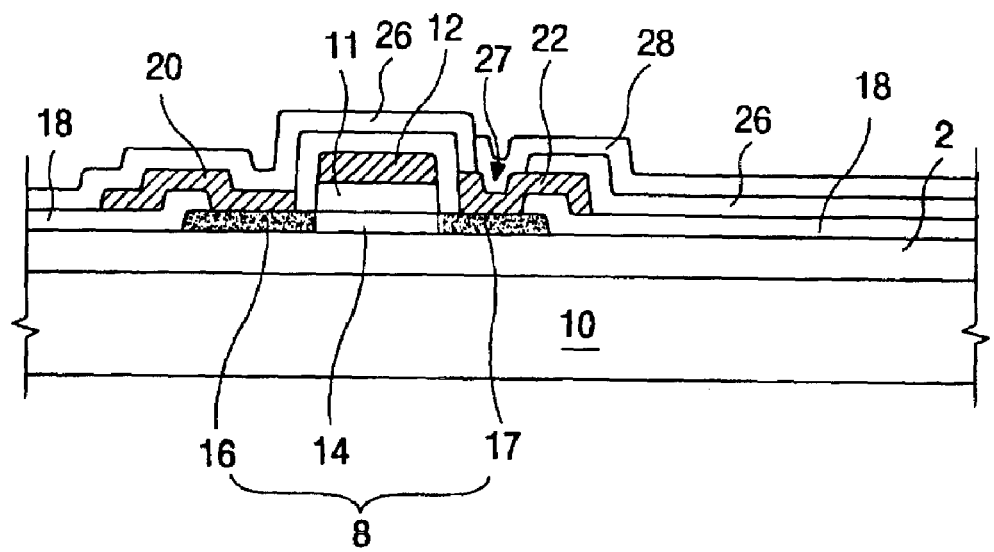
Figure 3A:
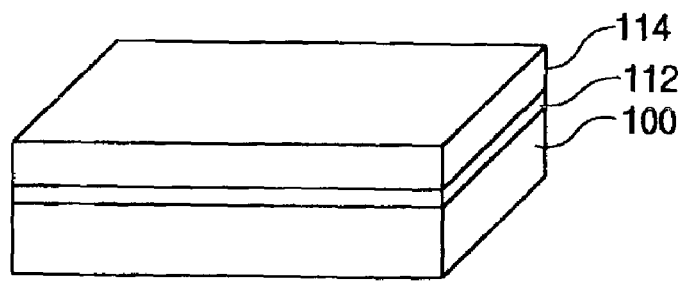
FIGS. 3A to 3C are perspective views illustrating sequentially process steps of forming a polycrystalline silicon layer according to a first embodiment of the present invention.
Figure 3B:
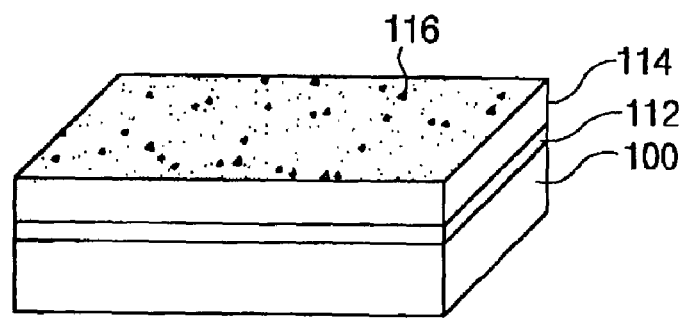
Figure 3C:
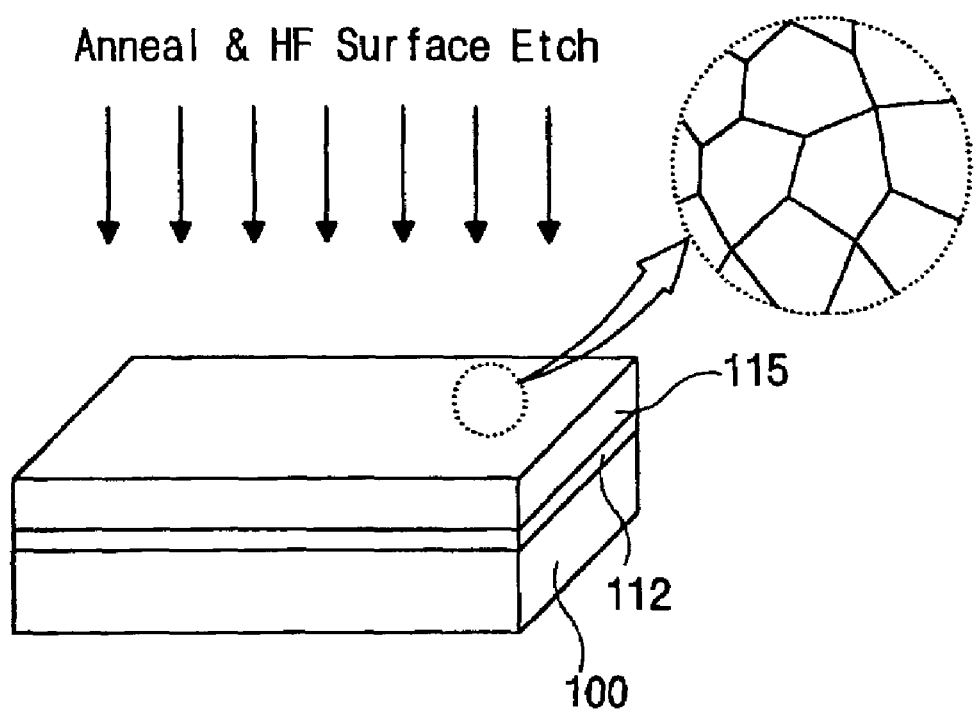

FIGS. 3A to 3C are perspective views illustrating sequentially process steps of forming a polycrystalline silicon layer according to a first embodiment of the present invention;

Referring to FIG. 3A, a buffer layer 112 is first formed on a substrate 100. The buffer layer 112 is preferably silicon nitride ($SiN_x$) or silicon oxide ($SiO_2$), for example. Then, an amorphous silicon layer 114 is formed on the buffer layer 112. Here, the buffer layer 112 prevents alkali substances and the like included in the substrate 100 from spreading into the amorphous silicon layer 114.

Referring to FIG. 3B, a catalytic metal 116 is applied to the surface of the amorphous silicon layer 114. The catalytic metal 105 on the amorphous silicon layer 104 may be in the form of dots or the like. Nickel (Ni), Lead (Pb), Cobalt (Co) or the like is preferably employed for the catalytic metal 116. In forming the catalytic metal 116 on the amorphous silicon layer 112, an ion shower method, an ion doping method, a sputtering method or a chemical vapor deposition (CVD) method can be employed. When applying heat to the amorphous silicon layer 114 including the catalytic metal 116 thereon, the amorphous silicon layer 114 is converted into a polycrystalline silicon layer 115 as shown in FIG. 3C. The resulting polycrystalline silicon layer 115 has a large number of grains therein.

After the polycrystalline silicon layer 115 is formed, it is annealed in an $N_2$ gas atmosphere at a predetermined temperature. This $N_2$ gas annealing stabilizes the surface of the polycrystalline silicon layer and helps surface-etching that is to be performed in a later step. Furthermore, the annealing in the $N_2$ gas atmosphere helps rapidly diffuse the dopant in a later doping process. That is, the $N_2$ gas annealing prevents the deterioration of the silicon layer in the etching and helps doping processes.

After the $N_2$ gas annealing, the surface of the polycrystalline silicon layer 115 is slightly etched by an etchant including HF (hydrogen fluoride) to remove a residual catalytic metal that may be left on the polycrystalline silicon surface after the crystallization. In addition, the HF etching removes impurities that may be generated during the deposition of the silicon layer.

FIGS. 4A to 4D are cross-sectional views illustrating sequentially process steps of forming a thin film transistor using a polycrystalline silicon layer according to the first embodiment of the present invention.

Figure 4A:
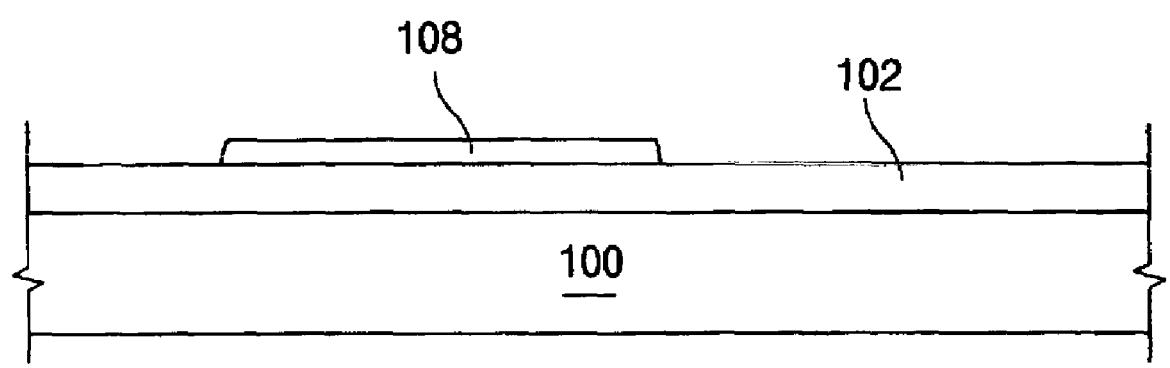
FIGS. 4A to 4D are cross-sectional views illustrating sequentially process steps of forming a thin film transistor using a polycrystalline silicon layer according to the first embodiment of the present invention.

Referring to FIG. 4A, a buffer layer 102 is first formed on the substrate 100. Thereafter, a polycrystalline silicon layer is formed on the buffer layer 102 using the process mentioned above with reference to FIGS. 3A to 3C, and then patterned to form an island-shaped active layer 108.

Figure 4B:
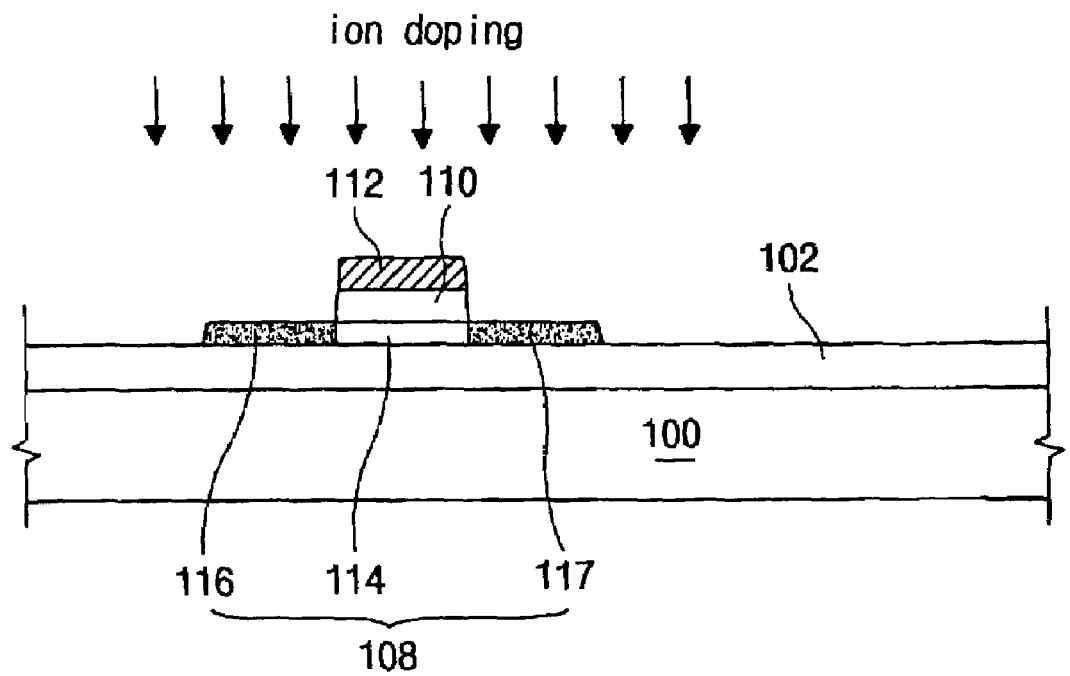

Referring to FIG. 4B, a gate insulation layer 110 and a gate electrode 112 are formed on the active layer 108. The active layer 108 is divided into two areas: a first active area 114 that is an intrinsic silicon area, and second active areas 116 and 117 where impurity ions are to be doped. The gate insulation layer 110 and the gate electrode 112 are disposed to define the first active area 114. In forming the gate insulating layer 110 and the gate electrode 112, an insulating film and a metal layer are successively formed on the buffer layer 102 and on the island-shaped active layer 108, and then, the insulating film and the metal layer are patterned to define the first active area 114. To reduce a mask process, only one mask is used for patterning the gate insulation layer 110 and the gate electrode 112. Thus, the gate insulation layer 110 and the gate electrode 112 have the same pattern-shape on the first active area 114. The second active areas 116 and 117 of the active layer 108 are positioned on respective sides of the first active area 114. The gate insulation layer 110 preferably is made of silicon nitride ($SiN_x$), silicon oxide ($SiO_2$), or Tetra Ethoxy Silane (TEOS), for example.

After forming the gate insulation layer 110 and the gate electrode 112 on the first active area 114 of the active layer 108, p-type ions, e.g., boron, are doped into the second active areas 116 and 117. Since the gate electrode 112 is disposed above the first active area 114 and acts as an ion stopper, the dopant p-type ions are not doped into the first active area 114. Thus, the first active area 114 remains as an intrinsic silicon region, whereas the second active areas 116 and 117 become doped silicon regions. That is, the second active areas 116 and 117 become source and drain regions, respectively. The above-mentioned dopant p-type ions include a group III element, such as boron (B). For example, $B_2H_6$ is used for such a dopant. After the ion doping is finished, the doped portions 116 and 117 of the island-shaped active layer 108 become a p-type semiconductor.

Figure 4C:
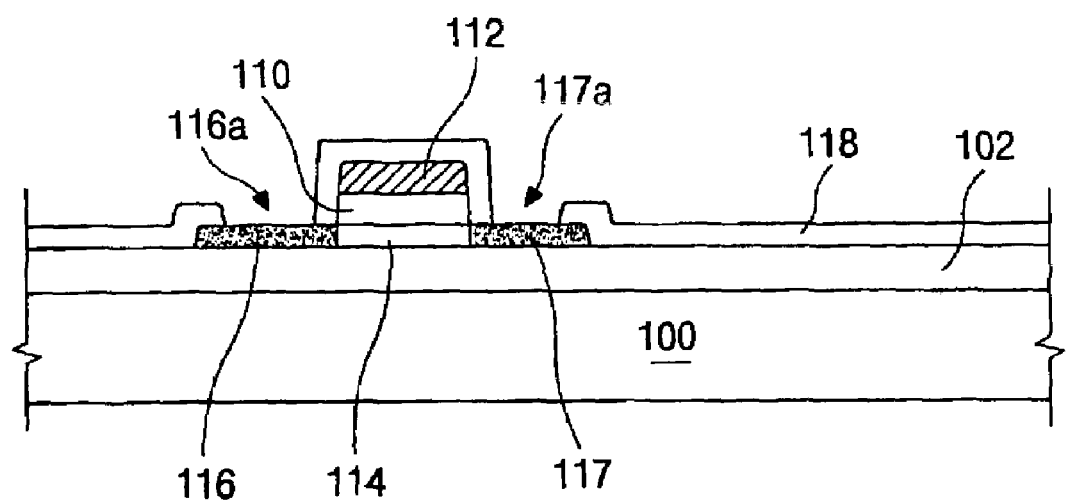

Referring to FIG. 4C, an interlayer insulator 118 is formed to cover the gate electrode 112, the first active area 114, and the second active areas 116 and 117. Thereafter, a source contact hole 116a and a drain contact hole 117a are formed in the interlayer insulator 118, thereby exposing the second active areas 116 and 117, respectively. As mentioned above, the second active areas 116 and 117 are source and drain regions on which source and drain electrodes are formed, respectively.

Figure 4D:
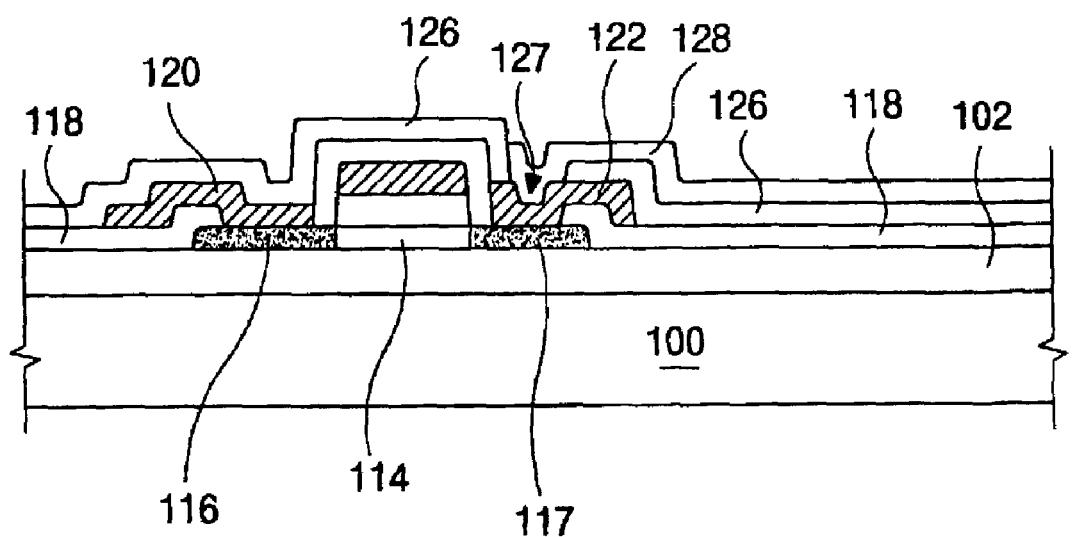

Referring to FIG. 4D, a source electrode 120 and a drain electrode 122 are formed on the interlayer insulator 118. The source and drain electrodes 120 and 122 electrically contact the source and drain regions 116 and 117, respectively, through the respective source and drain contact holes 116a and 117a. This completes a thin film transistor having p-type polycrystalline silicon source and drain regions.

Thereafter, a passivation layer 126 is formed to cover the source and drain electrodes 120 and 122, and then patterned to form a pixel contact hole 127 that exposes a potion of the drain electrode 122. On the surface of the passivation layer 126, a transparent conductive material is deposited and then patterned to form a pixel electrode 128. Thus, the pixel electrode 128 formed on the passivation layer 126 electrically contacts the drain electrode 122 through the pixel contact hole 127.

In the first embodiment of the present invention described above with reference to FIGS. 3A-3C and 4A-4D, the annealing in the $N_2$ gas atmosphere and the HF surface etching are sequentially performed to the polycrystalline silicon layer. Accordingly, the surface of the polycrystalline silicon layer is stabilized and the residual metal is removed from polycrystalline silicon layer.

In a second embodiment of the present invention, an ion doping method is employed to remove the residual catalytic metal. The second embodiment of the present invention will be explained hereinafter with accompanying drawings.

FIGS. 5A to 5F are perspective views illustrating sequentially process steps of forming a polycrystalline silicon layer according to a second embodiment of the present invention.

Figure 5A:
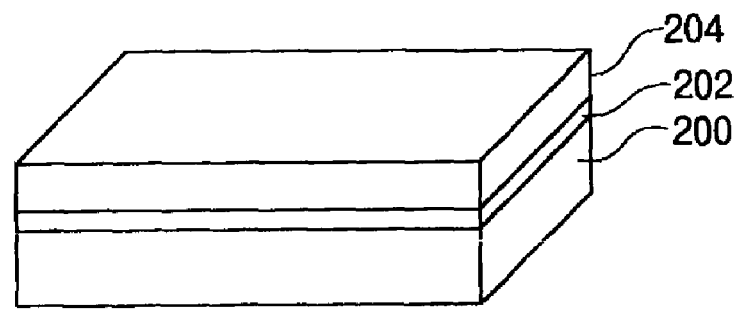
FIGS. 5A to 5F are perspective views illustrating sequentially process steps of forming a polycrystalline silicon layer according to a second embodiment of the present invention.

Referring to FIG. 5A, a buffer layer 202 is first formed on a substrate 200. The buffer layer 202 is silicon nitride ($SiN_x$) or silicon oxide ($SiO_2$), for example. Then, an amorphous silicon layer 204 is formed on the buffer layer 202. As mentioned above, the buffer layer 202 prevents alkali substances and the like included in the substrate 200 from spreading into the amorphous silicon layer 204.

Figure 5B:
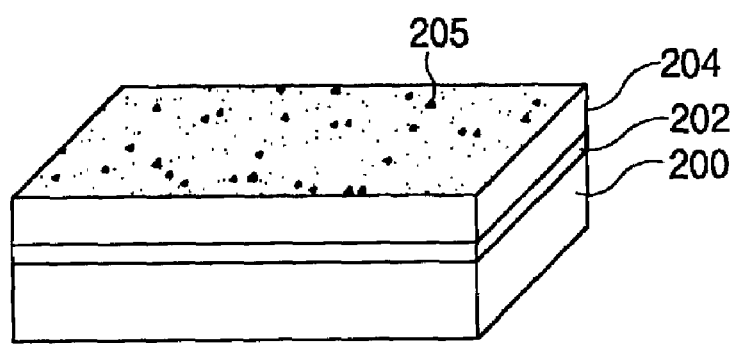
Figure 5C:
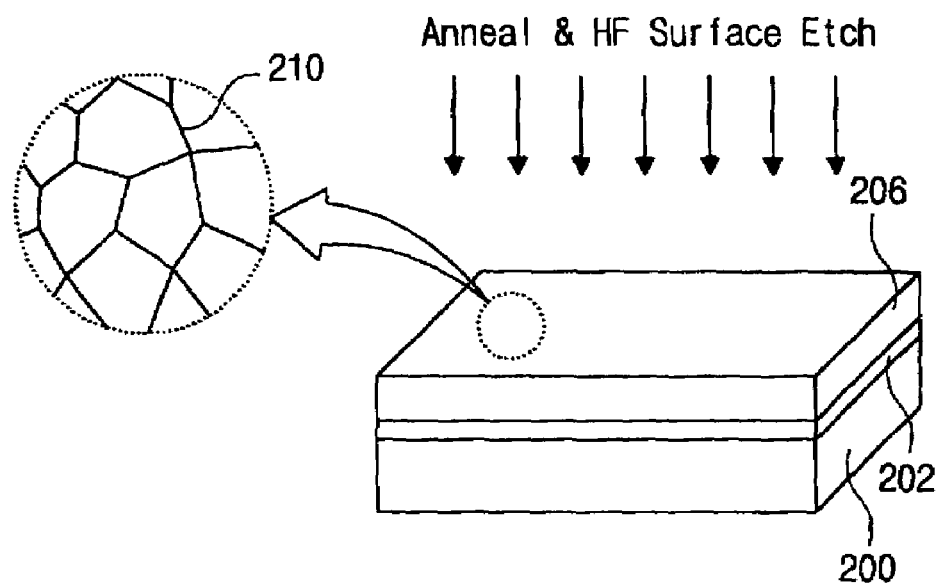

Referring to FIG. 5B, a catalytic metal 205 is formed on the surface of the amorphous silicon layer 202. Nickel (Ni), Lead (Pb), Cobalt (Co) or the like is preferably employed for the catalytic metal 205. Thereafter, heat is applied to the amorphous silicon layer 204 having the catalytic metal 205 thereon, so that silicon of the amorphous silicon layer 204 reacts with the catalytic metal 205 at the surface of the amorphous silicon layer 204. The reaction of the silicon and catalytic metal 205 forms silicide ($NiSi_2$). The resulting silicide diffuses into the interior of the amorphous silicon layer 204 and helps convert the amorphous silicon layer 204 into a polycrystalline silicon layer 206 of FIG. 5C. The polycrystalline silicon layer 206 has a large number of grains 210 therein, as shown in FIG. 5C.

In forming the catalytic metal 205 on the amorphous silicon layer before crystallization, an ion shower method, an ion doping method, a sputtering method or a chemical vapor deposition (CVD) method can be employed.

After forming the polycrystalline silicon layer 206, an annealing process in an $N_2$ gas atmosphere is performed at a predetermined temperature. As described before, the $N_2$ gas annealing stabilizes the surface of the polycrystalline silicon layer 206 and helps an etching process of the polycrystalline silicon layer 206 when forming a thin film transistor in a later step. Furthermore, the annealing in the $N_2$ gas atmosphere helps rapidly diffuse the dopant in a later doping process. That is, the $N_2$ gas annealing prevents the deterioration of the silicon layer in the etching and the doping processes. After the $N_2$ gas annealing, the surface of the polycrystalline silicon layer 206 is slightly etched by an etchant including HF (hydrogen fluoride) to remove a residual catalytic metal that may be left on the polycrystalline silicon surface after the crystallization. In addition, the HF etching removes impurities that may be generated during the deposition of the silicon layer.

Figure 5D:
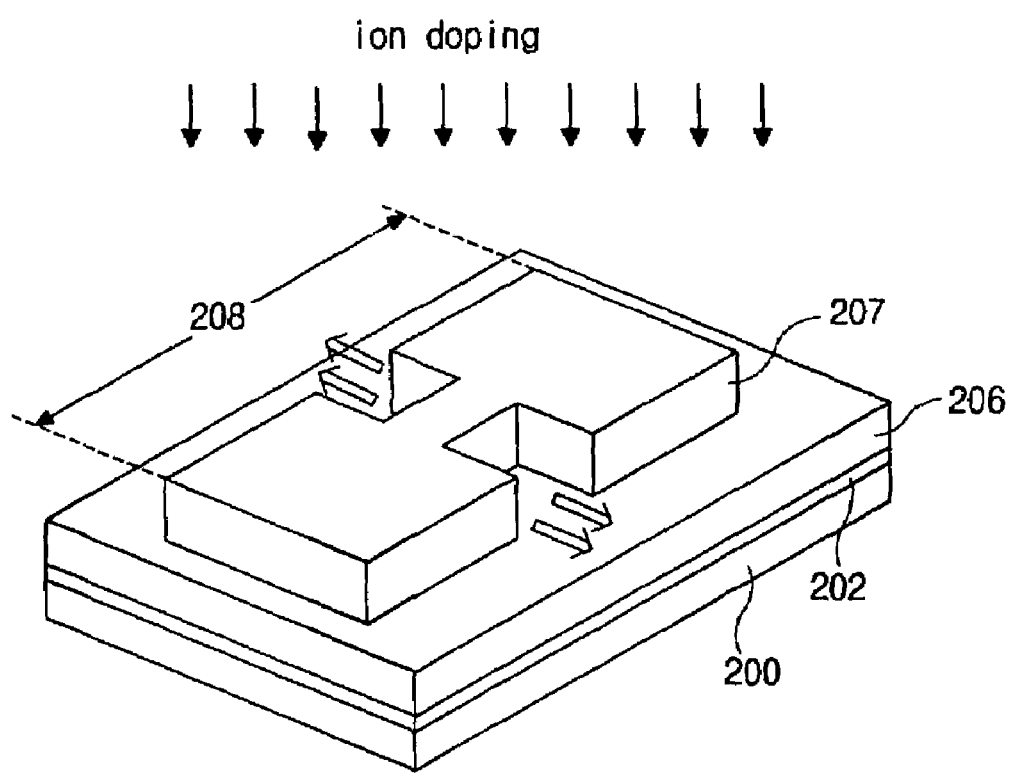

Referring to FIG. 5D, an island pattern 207 is formed on the polycrystalline silicon layer 206. The island pattern 107 may be formed of a silicon oxide layer or a silicon nitride layer, for example. The island pattern 207 has an H-shape that is the same shape as an active layer (or active region) to be formed in a later step. That is, the island pattern 207 defines an active layer (or active region) 208 in the polycrystalline silicon layer 206 (FIG. 5E).

After forming the island pattern 207 on the polycrystalline silicon layer 206, n-type ions are doped into the polycrystalline silicon layer 206. Then, a heat treatment is applied to the doped polycrystalline silicon layer 206 in order to eliminate the residual metal from the active region 208 of the polycrystalline silicon layer 206. During the heat treatment, the metal left in the active region 208 diffuses out from the active areas covered by the island pattern 207 to the exposed polycrystalline silicon area and reacts with the n-type ion dopant. That is, the residual catalytic metal beneath the island pattern 207 diffuses by the heat treatment, and then produces a metal compound in the exposed area of the polycrystalline silicon layer 206. If the catalytic metal is nickel (Ni) and the dopant is phosphorus (P), Ni reacts with P and produces NiP in the exposed silicon area during the heat treatment. Therefore, the metal underneath the island pattern 207, such as in the active area 208, if any, is removed. Furthermore, since the island pattern 207 acts as an ion stopper, the n-type ion dopant is not doped underneath the island pattern 207 into the active area 208. The dosage of the n-type ions is, for example, within a range of about $1\times10^{18}$ atoms/cm$^3$ to about $3\times10^{21}$ atoms/cm$^3$. The dosage of the n-type ions can be determined such that the subsequent heat treating removes substantially all catalytic metal from the active region 108 underneath the island pattern 107. In using ion implantation for the doping, a preferred acceleration voltage is within a range of about 5 keV to about 30 keV.

Figure 5E:
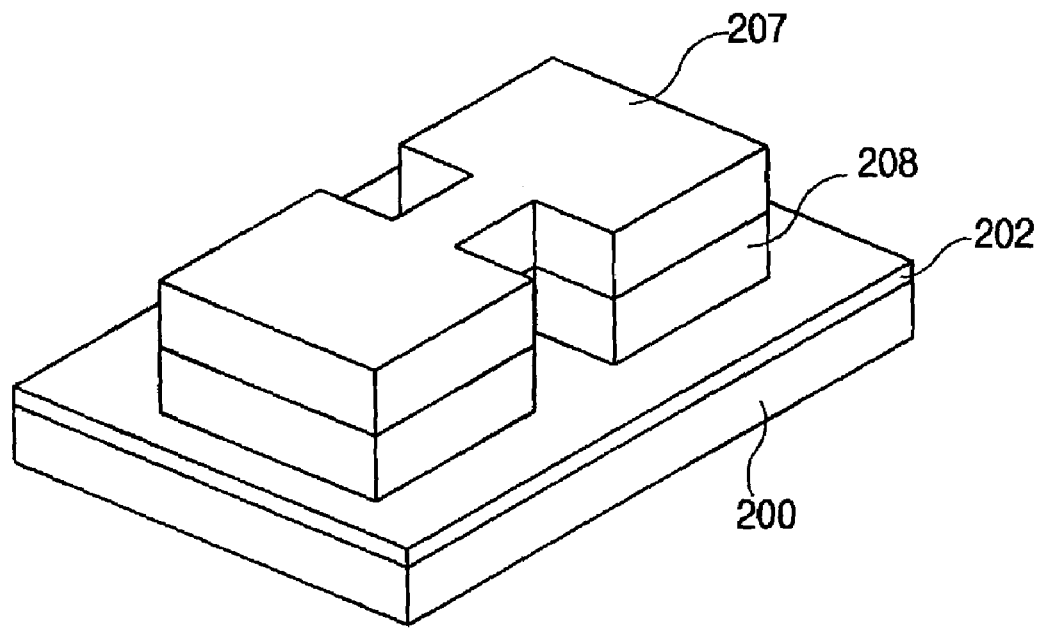

Referring to FIG. 5E, the polycrystalline silicon layer 206 of FIG. 5D is patterned using the island pattern 207 as a mask to define the active layer 208 beneath the island pattern 207. Thereafter, the island pattern 207 is removed from the active layer 208 as shown in FIG. 5F.

FIGS. 6A to 6D are cross-sectional views illustrating sequentially process steps of forming a thin film transistor using a polycrystalline silicon layer according to the second embodiment of the present invention.

Figure 5F:
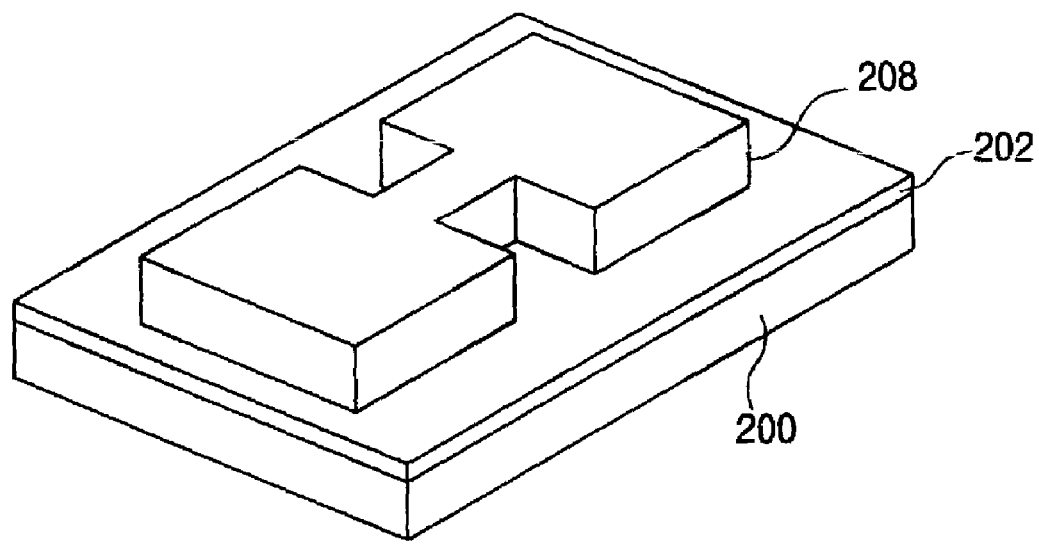
Figure 6A:
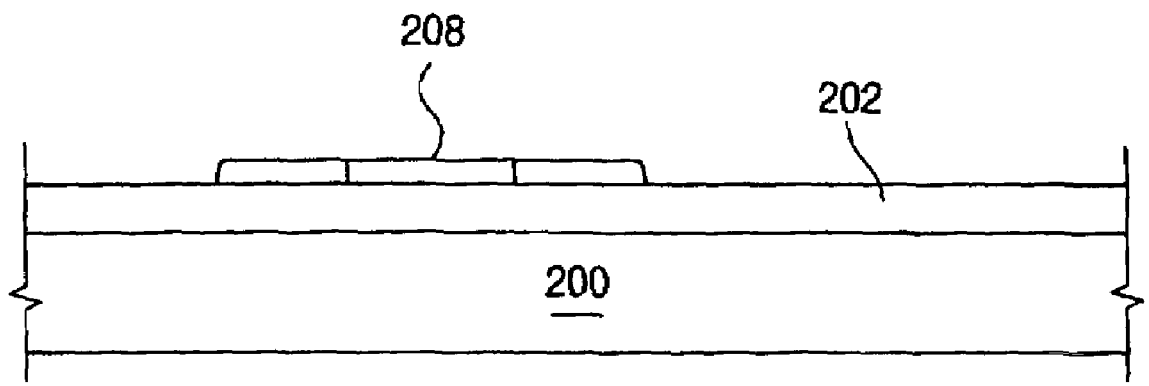
FIGS. 6A to 6D are cross-sectional views illustrating sequentially process steps of forming a thin film transistor using a polycrystalline silicon layer according to the second embodiment of the present invention.

FIG. 6A shows a cross-sectional view of FIG. 5F and illustrates the active layer 208 that is formed according to the second embodiment of the present invention. As mentioned before, the buffer layer 202 is first formed on the substrate 200, and then, the active layer 208 is formed on the buffer layer 202 by the process illustrated in FIGS. 5A to 5F. The buffer layer 202 is provided to protect the active layer 208 from alkali substances and the like, which may be generated from the substrate 200 during subsequent processes.

Figure 6B:
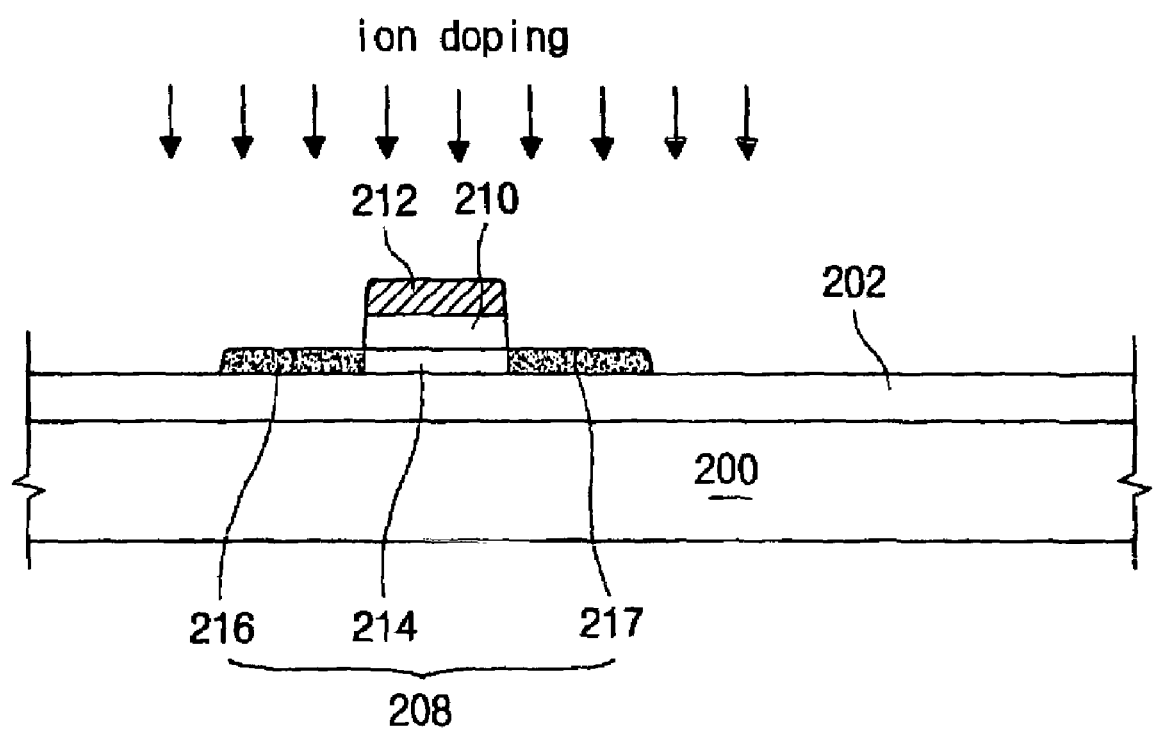

Referring to FIG. 6B, a gate insulation layer 210 and a gate electrode 212 are formed on the active layer 208 to define a first active area 214 underneath and second active areas 116 and 117 at the respective sides. To reduce the mask process, the gate insulation layer 210 and the gate electrode 212 are formed using the same mask, and thus, have substantially the same pattern-shape on the first active area 214. In the present embodiment, the buffer layer 202 and the gate insulation layer 210 may be made of silicon oxide ($SiO_2$), silicon nitride ($SiN_x$), or tetra ethoxy silane (TEOS), for example. As mentioned before, the first active area 214 is centered between the second active areas 216 and 217.

Thereafter, an ion doping is carried out by injecting a dopant, such as p-type ions, into the active layer 208. Since the gate electrode 212 severs as an ion stopper, the first active area 214 remains as an intrinsic silicon region, whereas the second active areas 216 and 217 become doped silicon regions. That is, the second active areas 216 and 217 become source and drain regions, respectively. If the dopant is, for example, B₂H₆ that includes a Group III element, the doped portions of the active layer 208, i.e., the second active areas 216 and 217, become a p-type semiconductor. Since the active layer 208 having the first and second active areas 214, 216 and 217 is previously annealed in the N₂ gas atmosphere, the p-type ion dopant can diffuse rapidly into the second active areas 216 and 217. Thus, the resulting active layer 208 having p-type semiconductor regions possesses improved characteristics and desired thin film characteristics.

Figure 6C:
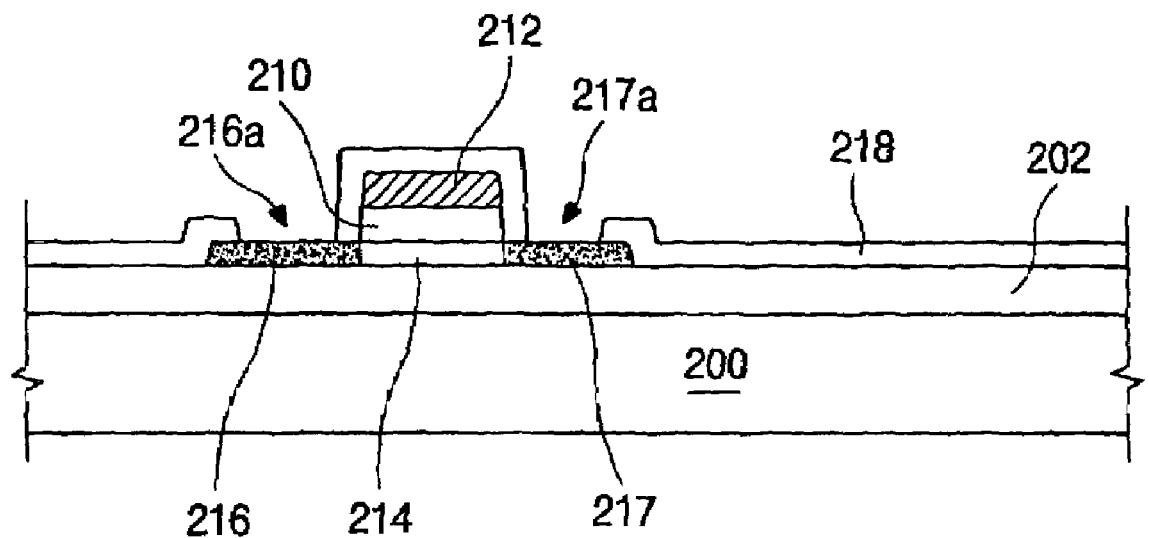

Referring to FIG. 6C, an interlayer insulating layer 218 is formed to cover the gate electrode 212, the gate insulation layer 210, and the source and drain regions 216 and 217. A source contact hole 216a and a drain contact hole 217a are formed in the interlayer insulating layer 218, thereby exposing the source and the drain regions 216 and 217, respectively.

Figure 6D:
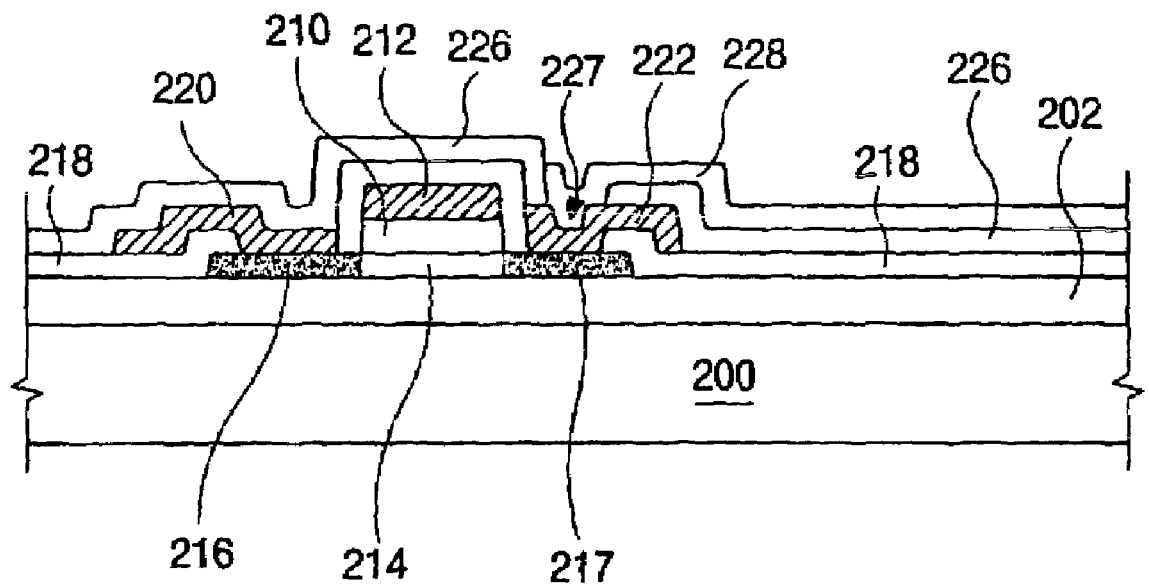

Referring to FIG. 6D, a source electrode 220 and a drain electrode 222 are formed on the interlayer insulating layer 218. The source and the drain electrode 220 and 222 electrically contact the source and the drain regions 216 and 217, respectively, through the respective source and drain contact holes 216a and 217a. Thereafter, a passivation layer 226 is formed to cover the source electrode 220 and the drain electrode 222, and then, the passivation layer 226 is patterned to form a pixel contact hole 227 therein to expose a portion of the drain electrode 222. Thereafter, a layer made of a transparent conductive material, for example, indium tin oxide or indium zinc oxide, is formed on the passivation layer 226 and then patterned to form a pixel electrode 228. The pixel electrode 228 electrically contacts the drain electrode 222 through the pixel contact hole 227.

In the above-described second embodiment of the present invention, the polycrystalline silicon layer that has been crystallized using the catalytic metal is annealed in the N₂ gas atmosphere with a heat treatment. This N₂ gas annealing helps remove the residual metal from the polycrystalline silicon layer when etching the surface of the polycrystalline silicon layer using the etchant including HF. Furthermore, the N₂ gas annealing with a heat treatment helps eliminate the residual metal from the active layer, because the annealing promotes the diffusion of n-type ions when doping the n-type ions on the polycrystalline silicon for the residual metal removal. The N₂ gas annealing also stabilizes the surface of the polycrystalline silicon layer and prevents the surface defects thereof. Moreover, due to the N₂ gas annealing process, the dopant applied to the active layer to form the source and drain contact areas can rapidly diffuse into the active areas, thereby increasing the electric properties of the thin film transistor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming a polycrystalline silicon active layer for use in a thin film transistor, comprising:
    forming a buffer layer over a substrate;
    forming an amorphous silicon layer over the buffer layer;
    applying a catalytic metal to a surface of the amorphous silicon layer;
    crystallizing the entire amorphous silicon layer having the catalytic metal thereon into a whole polycrystalline silicon layer;
    annealing the whole polycrystalline silicon layer directly on the buffer layer and having the catalytic metal thereon in an N₂ gas atmosphere to stabilize the whole polycrystalline silicon layer;
    after annealing, etching a surface of the stabilized whole polycrystalline silicon layer using an etchant to remove a residual catalytic metal left on the surface of the whole polycrystalline silicon layer; and
    patterning the whole polycrystalline silicon layer to form an island-shaped active layer
    wherein said annealing the whole polycrystalline silicon layer is performed after crystallizing the entire amorphous silicon layer.

2. The method of claim 1, wherein applying the catalytic metal includes forming dots of the catalytic metal on the surface of the amorphous silicon layer.

3. The method of claim 1, wherein annealing the whole polycrystalline silicon layer includes applying heat to the whole polycrystalline silicon layer.

4. The method of claim 3, wherein the catalytic metal is one of nickel (Ni), lead (Pb), and cobalt (Co).

5. The method of claim 1, wherein the etchant in etching the surface of the polycrystalline silicon layer includes hydrogen fluoride (HF).

6. The method of claim 1, wherein crystallizing the amorphous silicon layer includes applying heat to the amorphous silicon layer.

7. The method of claim 1, wherein the buffer layer includes at least one of silicon oxide ($SiO_2$) and silicon nitride ($SiN_x$).

8. A method of forming a polycrystalline silicon thin film transistor, comprising:
    forming a buffer layer over a substrate;
    forming an amorphous silicon layer over the buffer layer;
    applying a catalytic metal to a surface of the amorphous silicon layer;
    crystallizing the entire amorphous silicon layer having the catalytic metal thereon into a whole polycrystalline silicon layer;
    annealing the whole polycrystalline silicon layer directly on the buffer layer and having the catalytic metal thereon in an N₂ gas atmosphere to stabilize the whole polycrystalline silicon layer;
    after annealing, etching a surface of the stabilized whole polycrystalline silicon layer using an etchant to remove a residual catalytic metal left on the surface of the whole polycrystalline silicon layer;
    patterning the whole polycrystalline silicon layer to form an island-shaped active layer;
    forming a gate insulation layer on a first area of the island-shaped active layer;
    forming a gate electrode on the gate insulation layer;
    applying a dopant to the island-shaped active layer using the gate electrode as a mask to form source and drain regions on respective sides of the first active area;
    forming a second insulation layer to cover the gate electrode and the source and drain regions;
    forming source and drain contact holes in the second insulation layer to expose portions of the source region and the drain region, respectively; and
    forming source and drain electrodes, the source electrode contacting the source region through the source contact hole, and the drain electrode contacting the drain region through the drain contact hole.

9. The method of claim 8, wherein applying the catalytic metal includes forming dots of the catalytic metal on the surface of the amorphous silicon layer.

10. The method of claim 8, wherein annealing the whole polycrystalline silicon layer includes applying heat to the whole polycrystalline silicon layer.

11. The method of claim 8, wherein the catalytic metal is one of nickel (Ni), lead (Pb) and cobalt (Go).

12. The method of claim 8, wherein the etchant used in etching the surface of the whole polycrystalline silicon layer includes hydrogen fluoride (HF).

13. The method of claim 8, wherein crystallizing the amorphous silicon layer includes applying heat to the amorphous silicon layer.

14. The method of claim 8, wherein the buffer layer includes at least one of silicon oxide ($SiO_2$) and silicon nitride ($SiN_x$).

15. The method of claim 8, wherein the gate insulation layer includes at least one of silicon oxide ($SiO_2$), silicon nitride ($SiN_x$) and tetra ethoxy silane (TEOS).

16. The method of claim 8, wherein the dopant is p-type ions.

17. The method of claim 8, wherein applying a dopant to the island-shaped active layer includes doping a $B_2H_6$ gas to the island-shaped active layer using the gate electrode as a mask to form p-type source and drain regions.

* * * * *